COAXIAL CAVITY RESONATOR PHASE COMPARATOR
FOR AUTOMATIC FREQUENCY CONTROL SYSTEM
Filed June 30, 1966

INVENTOR
HANS KUHN

BY Percy P. Lantzy
ATTORNEY

United States Patent Office 3,360,741
Patented Dec. 26, 1967

3,360,741

COAXIAL CAVITY RESONATOR PHASE COMPARATOR FOR AUTOMATIC FREQUENCY CONTROL SYSTEM

Hans Kuhn, Pforzheim, Germany, assignor to International Standard Electric Corporation, New York, N.Y., a corporation of Delaware Filed June 30, 1966, Ser. No. 561,791
Claims priority, application Germany, July 16, 1965, St 24,143
10 Claims. (Cl. 331—9)

Figure 1:
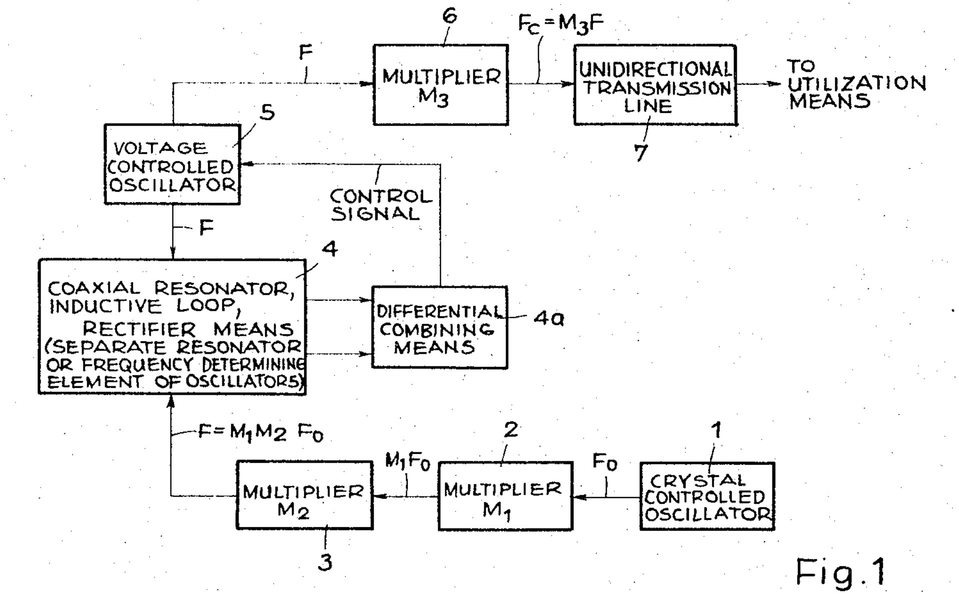

The present invention relates to phase comparators and more particularly to a coaxial type of resonator for comparing the phase relationship of a quartz-stabilized reference frequency signal and the oscillatory signal of a very high frequency, free running oscillator.

In long distance radio link systems, the wideband message to be transmitted is modulated onto a carrier of very high frequency. The wider the frequency band required by the message, for instance, a multichannel composite signal, the higher the carrier frequency must be. The stabilization of this carrier frequency is more difficult the higher the carrier frequency is. As is well known, the upper limit for stabilizing a frequency with the aid of a quartz-crystal is approximately 100 mc./s. If frequencies beyond this limit are to be stabilized with the aid of quartz-crystals, it has been heretofore necessary to multiply the quartz-crystal frequency. Thus, it has been customary to produce an oscillator signal having a frequency of 6.4 gc./s. by a 64-fold multiplication of a quartz-stabilized oscillatory signal of 100 mc./s. in a multiplier chain. Such a high multiplication factor, however, causes a relatively high interference noise due to unintended frequency modulation. In order to be able to reduce this unwanted noise component, the stabilized output frequency must be increased and the multiplication factor must be reduced.

An object of this invention is to provide a phase comparison arrangement that will enable the achievement of an increase in the frequency of the stabilized signal and a reduction in the multiplication factor thereof to reduce the above-described noise component of the prior art.

A feature of this invention is the provision of a phase comparator for comparing the phase of an oscillator signal having a given frequency and a reference signal having said given frequency comprising a resonator means having a resonant frequency equal to said given frequency, an inductive coupling loop means having two output terminals to couple two signals phase shifted 180° with respect to each other from said resonator and an electric center point to couple said reference signal into said loop means, and means coupled to the two output terminals to produce a control signal proportional to the phase relationship between the two output signals with respect to the center point of the loop means.

Another feature of this invention is the utilization of the above derived control signal to control the frequency of an oscillator producing the oscillator signal for frequency stabilization thereof.

Still another feature of this invention is the provision of the resonator means being in an external relationship to the oscillator having an oscillatory signal frequency stabilized.

A further feature of this invention is the provision of the resonator being the frequency determining element of the oscillator having its oscillatory signal frequency stabilized.

Figure 2:
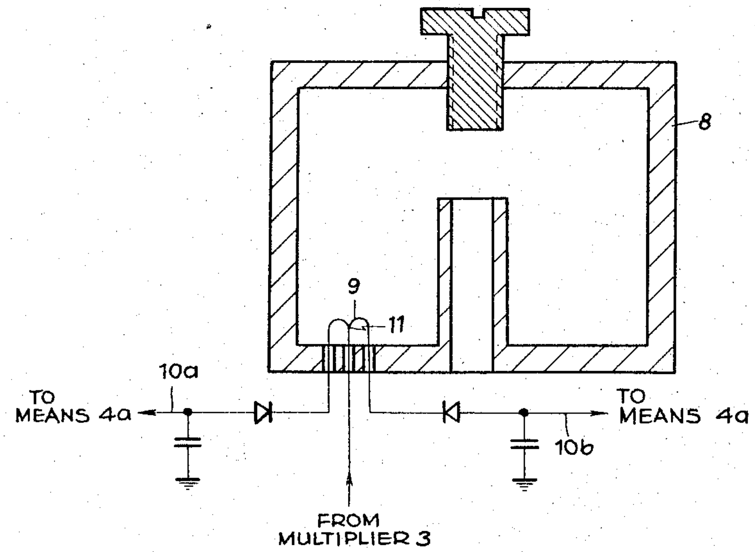

The above-mentioned and other features and objects of this invention will become more apparent by reference to the following description taken in conjunction with the accompanying drawings in which:

FIG. 1 is a block diagram of a frequency stabilizing arrangement in accordance with the principles of this invention which enables obtaining the object thereof; and FIG. 2 is a cross-sectional view of the cavity resonator and a schematic illustration of the inductive coupling loop and rectifier means of FIG. 1 in which the phase comparison is accomplished in accordance with the principles of this invention.

Referring to FIG. 1, the reference signal of frequency F is obtained from crystal controlled oscillator 1 whose output is multiplied by multipliers 2 and 3 having a multiplication factor $M_1$ and $M_2$, respectively. The reference signal is coupled to the phase comparator including coaxial resonator, inductive coupling loop and rectifier means 4. To this same means 4 is coupled the signal from voltage controlled oscillator 5 to be stabilied having a stabilized frequency F. Means 4 cooperates to produce two output signals which are differentially combined in differential combining means **4*a* to produce a control signal proportional to the phase relationship between the reference signal and the oscillator signal of oscillator 5. This control signal will act upon oscillator 5 to lock the frequency and phase of the oscillatory signal of oscillator 5 to the frequency and phase of the reference signal. This stabilized signal of oscillator 5 is then coupled to multiplier 6 having a multiplier factor $M_3$ to produce the desired stabilized carrier frequency which in turn is coupled by unidirectional transmission line 7** to a utilization means (not shown), such as a transmitter modulator.

To demonstrate that the frequency of the stabilizing signal has been increased and the multiplication factor thereof has been reduced to reduce the noise component of the prior art, let us assume certain values for the various frequencies and multiplying factors with the position in the circuit of FIG. 1 of these frequencies and multiplying factors being illustrated in FIG. 1. To provide a 6.4 gc./s. stabilized signal as in the above mentioned prior art, frequency $F_0$ at the output of oscillator 1 has a value of 100 mc./s. and is increased by multipliers 2 and 3 each of which have the multiplying factor of two to produce a reference signal having a frequency F equal to 400 mc./s. The stabilized output signal of oscillator 5 also has this value and if it is assumed that factor $M_3$ of multiplier 6 has a value of sixteen there is obtained a carrier frequency $F_c$ equal to 6.4 gc./s. Thus, the stabilized signal has been increased by a factor of four and the multiplication factor thereof has been decreased by a factor of four as compared to the abovementioned prior art.

Referring to FIG. 2, the components of means 4 are illustrated which permits the phase comparison between the high frequency of oscillator 5 and the multiplied crystal controlled frequency of oscillator 1 with this multiplied signal being the reference signal for the phase comparison. Resonator 8 is of the coaxial cavity type and may be external to the voltage controlled oscillator 5, or may constitute the frequency determining tank circuit of oscillator 5. A double inductive coupling loop 9 is inserted into resonator 8 and provides at outputs **10*a* and 10*b* two output signals of equal value but phase shifted by 180° with respect to each other. The reference signal from multiplier 3 is coupled to the electric center point 11 of loop 9. When the two rectified signals appearing at outputs 10*a* and 10*b* are equal they are phase shifted with respect to the center point 11** by 90° but are 180° out of phase with respect to each other. When these two outputs are coupled to means 4*a* of FIG. 1, the control signal will be zero. However, if the phase of the oscillatory signal of oscillator 5 deviates from the phase of the reference signal, the voltage appearing at outputs **10*a* and 10*b* will not be equal and, hence, the differential combining means 4*a* will produce a control signal which will control oscillator 5 to again establish phase equality between the output signal of oscillator 5 and the reference signal from multiplier 3**.

Although the description of this invention has been directed to the production of a stabilized carrier frequency for a transmitter, the same arrangement and technique can be employed to produce a high frequency, noise reduced, stabilized local oscillator signal for a receiver.

While I have described above the principles of my invention in connection with specific apparatus, it is to be clearly understood that this description is made only by way of example and not as a limitation to the scope of my invention as set forth in the objects thereof and in the accompanying claims.

I claim:

1. A phase comparator for comparing the phase of an oscillator signal having a given frequency and a reference signal having said given frequency comprising:
- a resonator means having a resonant frequency equal to said given frequency;
- an inductive coupling loop means having
  - two output terminals to couple two signals phase shifted 180 degrees with respect to each other from said resonator, and
  - an electric center point to couple said reference signal to said loop means; and
- means coupled to said two output terminals to produce a control signal proportional to the phase relationship between said two output signals with respect to said center point.

2. A comparator according to claim 1, wherein said resonator means includes a coaxial type of resonator.

3. A comparator according to claim 1, wherein said means producing said control signal includes
- a rectifier coupled to each of said output terminals, and a differential combining means coupled to each of said rectifiers.

4. A comparator according to claim 1, further comprising
- a source of said reference signal including
  - a crystal controlled oscillator providing an output signal having a frequency equal to a given integral fraction of said given frequency, and
  - multiplier means coupled to said crystal controlled oscillator to multiply said output signal and produce said reference signal.

5. A comparator according to claim 1, further comprising
- an oscillator circuit to produce said oscillator signal including said resonator means as the frequency determining element of said oscillator circuit.

6. A comparator according to claim 5, further comprising
- means coupled between said means producing said control signal and said oscillator circuit to couple said control signal to said oscillator circuit for returning thereof to establish phase equality between said reference signal and said oscillator signal.

7. A comparator according to claim 6, wherein said resonator means includes a coaxial type of resonator.

8. A comparator according to claim 7, wherein said means producing said control signal includes
- a rectifier coupled to each of said output terminals, and a differential combining means coupled to each of said rectifiers.

9. A comparator according to claim 8, further comprising
- a source of said reference signal including
  - a crystal controlled oscillator providing an output signal having a frequency equal to a given integral fraction of said given frequency, and
  - multiplier means coupled to said crystal controlled oscillator to multiply said output signal and produce said reference signal.

10. A comparator according to claim 5, further comprising
- means coupled to the output of said oscillator circuit to increase the frequency of said oscilator signal to a predetermined frequency for ultimate utilization thereof.

References Cited

UNITED STATES PATENTS 2,476,311 7/1949 Learned -------------- 331—9

NATHAN KAUFMAN, *Primary Examiner.*

ROY LAKE, *Examiner.*

S. H. GRIMM, *Assistant Examiner.*